(12) United States Patent
Andry et al.

(10) Patent No.: US 7,678,696 B2
(45) Date of Patent: Mar. 16, 2010

(54) METHOD OF MAKING THROUGH WAFER VIAS

(75) Inventors: Paul Stephen Andry, Yorktown Heights, NY (US); Edmund Juris Sprogis, Underhill, VT (US); Cornelia Kang-I Tsang, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 22 days.

(21) Appl. No.: 12/188,230

(22) Filed: Aug. 8, 2008

(65) Prior Publication Data

US 2010/0035430 A1    Feb. 11, 2010

(51) Int. Cl.
*H01L 21/44* (2006.01)
(52) U.S. Cl. .................. 438/667; 438/629; 438/672; 438/675; 257/E21.585
(58) Field of Classification Search .......... 438/629, 438/667, 672, 675; 257/301, E21.585, E23.083, 257/E21.649
See application file for complete search history.

(56) References Cited

U.S. PATENT DOCUMENTS

| | | | |
|---|---|---|---|
| 5,933,748 A * | 8/1999 | Chou et al. | .......... 438/431 |
| 5,998,292 A | 12/1999 | Black et al. | |
| 6,406,934 B1 | 6/2002 | Glenn et al. | |
| 7,005,388 B1 | 2/2006 | Hopper et al. | |
| 7,056,813 B2 | 6/2006 | Morrow et al. | |
| 7,071,098 B2 | 7/2006 | Kirby et al. | |
| 7,224,051 B2 | 5/2007 | Farnworth et al. | |
| 7,259,454 B2 | 8/2007 | Tanida et al. | |
| 7,271,491 B1 | 9/2007 | Akram | |
| 2005/0248002 A1 | 11/2005 | Newman et al. | |
| 2007/0045779 A1 | 3/2007 | Hiatt | |
| 2007/0196948 A1 | 8/2007 | Trezza | |
| 2007/0197018 A1 | 8/2007 | Chen et al. | |

OTHER PUBLICATIONS

U.S. Appl. No. 12/188,228; filed Aug. 8, 2008; Confirmation No. 4587; Customer No. 30449.
U.S. Appl. No. 12/188,229; filed Aug. 8, 2008; Confirmation No. 4593; Customer No. 30449.
U.S. Appl. No. 12/188,236; filed Aug. 8, 2008; Confirmation No. 4618; Customer No. 30449.
U.S. Appl. No. 12/188,241; filed Aug. 8, 2008; Confirmation No. 4625; Customer No. 30449.

* cited by examiner

*Primary Examiner*—Leonardo Andújar
*Assistant Examiner*—Monica D Harrison
(74) *Attorney, Agent, or Firm*—Schmeiser, Olsen & Watts; Richard M. Kotulak (57) ABSTRACT

A method of making a through wafer via. The method includes: forming a trench in a semiconductor substrate, the trench open to a top surface of the substrate; forming a polysilicon layer on sidewalls and a bottom of the trench; oxidizing the polysilicon layer to convert the polysilicon layer to a silicon oxide layer on the sidewalls and bottom of the trench, the silicon oxide layer not filling the trench; filling remaining space in the trench with an electrical conductor; and thinning the substrate from a bottom surface of the substrate and removing the silicon oxide layer from the bottom of the trench. The method may further include forming a metal layer on the silicon oxide layer before filling the trench.

20 Claims, 12 Drawing Sheets

METHOD OF MAKING THROUGH WAFER VIAS

FIELD OF THE INVENTION

The present invention relates to the field of integrated circuit chips; more specifically, it relates to through wafer vias for use in integrated circuit chips and the method of fabricating the through wafer vias.

BACKGROUND OF THE INVENTION

To increase the density of devices using integrated circuit chips it is desirable to allow interconnections to be made to both the top and bottom surfaces of the integrated circuit chip. This requires formation of through wafer vias from the top to the bottom surface of the integrated chip that are compatible with carrying both high frequency and DC signals. Many existing through via schemes are difficult to integrate into existing integrated circuit fabrication processes. Accordingly, there exists a need in the art to overcome the deficiencies and limitations described hereinabove.

SUMMARY OF THE INVENTION

A first aspect of the present invention is a method, comprising: forming a trench in a semiconductor substrate, the trench open to a top surface of the substrate; forming a polysilicon layer on sidewalls and a bottom of the trench; oxidizing the polysilicon layer to convert the polysilicon layer to a silicon oxide layer on the sidewalls and bottom of the trench, the silicon oxide layer not filling the trench; filling remaining space in the trench with an electrical conductor; and thinning the substrate from a bottom surface of the substrate and removing the silicon oxide layer from the bottom of the trench.

A second aspect of the present invention is a method, comprising: forming a trench in a semiconductor substrate, the trench open to a top surface of the substrate; forming a polysilicon layer on sidewalls and a bottom of the trench; oxidizing the polysilicon layer to convert the polysilicon layer to a silicon oxide layer on the sidewalls and bottom of the trench, the silicon oxide layer not filling the trench; forming a metal layer on the silicon oxide layer, the metal layer not filling the trench; filling remaining space in the trench with a polysilicon fill; and thinning the substrate from a bottom surface of the substrate and removing the silicon oxide layer from the bottom of the trench.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

The term through wafer via defines a structure that extends from a top surface of a substrate, through the substrate, to an opposite bottom surface of the substrate of the packaged integrated circuit or chip. A through wafer via according to the embodiments of the present invention are electrically conductive. The "wafer" of through wafer via derives from the fact that the via is formed before integrated circuits have been singulated from a semiconductor substrate called a wafer.

Figure 1A:
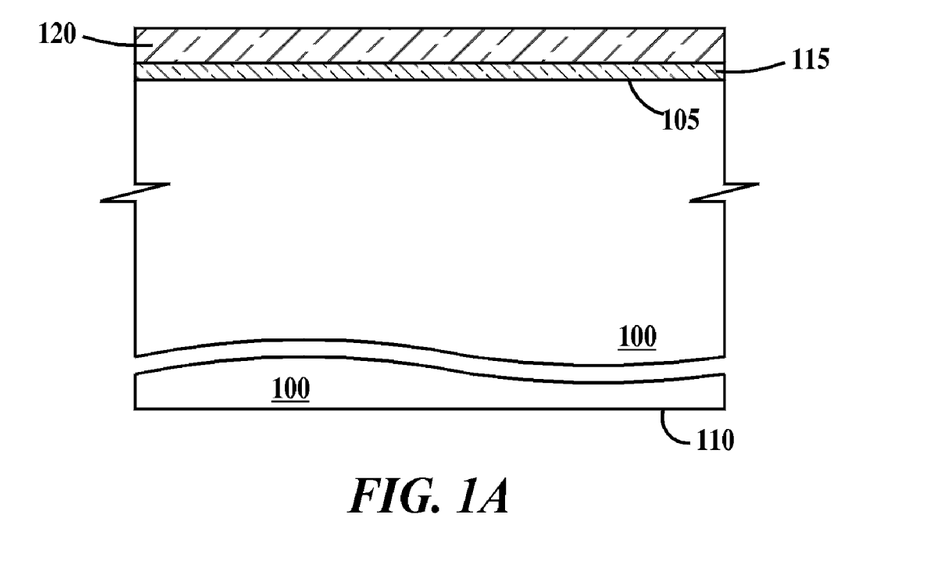
FIGS. 1A through 1D are cross-sectional drawings illustrating initial steps in the fabrication of through wafer vias according embodiments of the present invention.

FIGS. 1A through 1D are cross-sectional drawings illustrating initial steps in the fabrication of through wafer vias according embodiments of the present invention. In FIG. 1A, a semiconductor substrate 100 has a top surface 105 and a bottom surface 110. Formed on top surface 105 is a first dielectric layer 115. Formed on a top surface of first dielectric layer 115 is a second dielectric layer 120. First and second dielectric layers 115 and 120 are exemplary and there may be a few as one dielectric layer or more than two dielectric layers formed over top surface 105 of substrate 100. In one example, substrate 100 is a bulk silicon substrate. In one example first dielectric layer 115 is silicon dioxide and second dielectric layer 120 is silicon nitride.

Figure 1B:
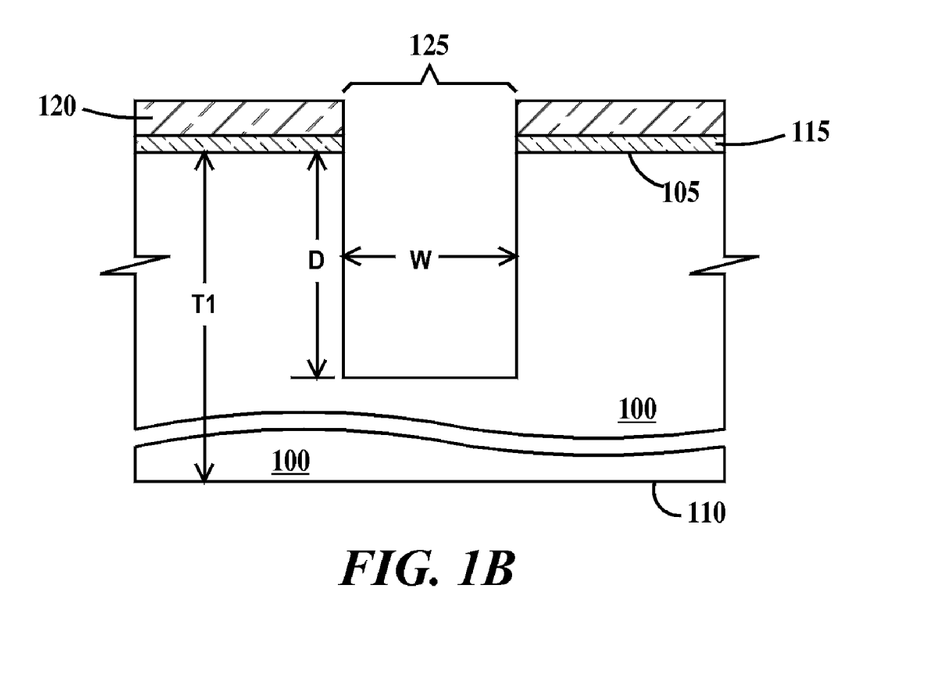

In FIG. 1B, a trench 125 is etched through first and second dielectric layers 115 and 120 and into substrate 100. Trench 125 may be formed using a photolithographic/etching process. An exemplary photolithographic/etching process comprises (1) forming a photoresist layer on second dielectric layer 120, (2) forming openings in the photoresist layer by exposing the photoresist layer to actinic radiation through a patterned photomask and developing away either the exposed or unexposed regions of the photoresist, (4) etching through, the first and second dielectric layers using, for example, a reactive ion etch (RIE) process, (5) removing the patterned photoresist layer, and (6) etching substrate 100 using, for example, an RIE process using the pattern in the first and second dielectric layers as a patterned hardmask.

Substrate 100 has a thickness of T1. T1 varies based on the diameter of the substrate. In one example, for a 200 mm diameter wafer T1 is about 750 microns. Trenches 125 extends into substrate 100 a distance D from top surface 105 of the substrate. Trench 125 has a width W. In one example, W is about 3 microns to about 10 microns. In one example D is about 50 microns to about 200 microns. In one example, W is about 5 microns and D is about 150 microns. Since trench 125 may be elongated in and out of the plane of the drawings (i.e., are rectangles when viewed from above), W measures minimum widths of trench 125 (i.e, the short side of the rectangle).

If substrate 100 is a silicon-on-insulator (SOI) substrate (i.e., a silicon substrate having a buried oxide layer or BOX layer) then the top surface of the buried oxide layer is located the distance D from top surface 105 of substrate 100. In one example, the BOX layer comprises silicon dioxide. The BOX layer will be removed in the backside thinning (e.g., grinding, chemical-mechanical-polishing (CMP), etching or combinations thereof) described infra in relationship to the first, second, third and fourth embodiments of the present invention.

Figure 1C:
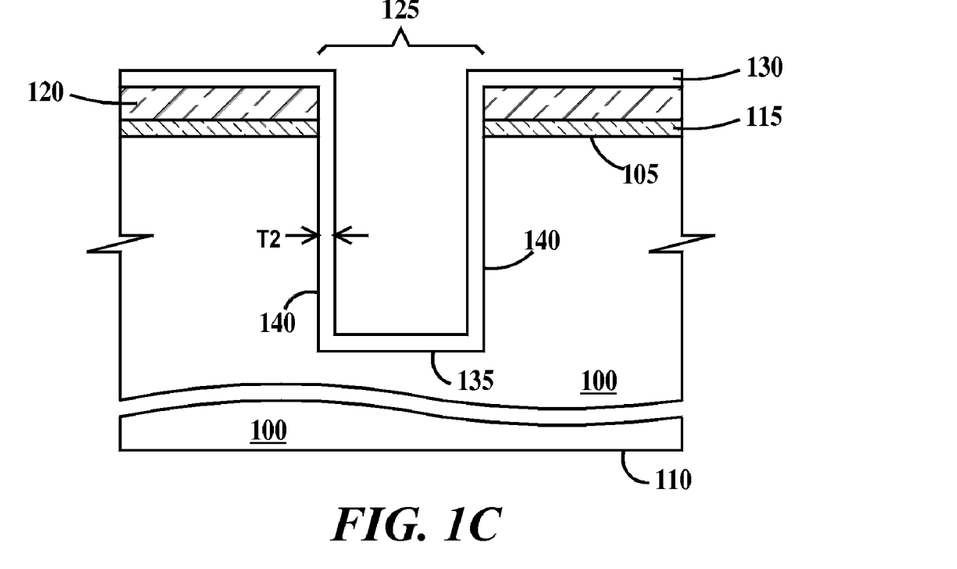

In FIG. 1C, a polysilicon layer 130 is deposited on exposed surfaces of first and second dielectric layers 115 and 120, a bottom 135 and sidewalls 140 of trench 125. In one example, polysilicon layer 130 comprises an N or a P-type doped polysilicon. In one example, polysilicon layer 130 comprises boron doped polysilicon. Polysilicon layer 130 has a thickness T2. In one example, T2 is about 0.8 microns to about 2.4 microns.

Figure 1D:
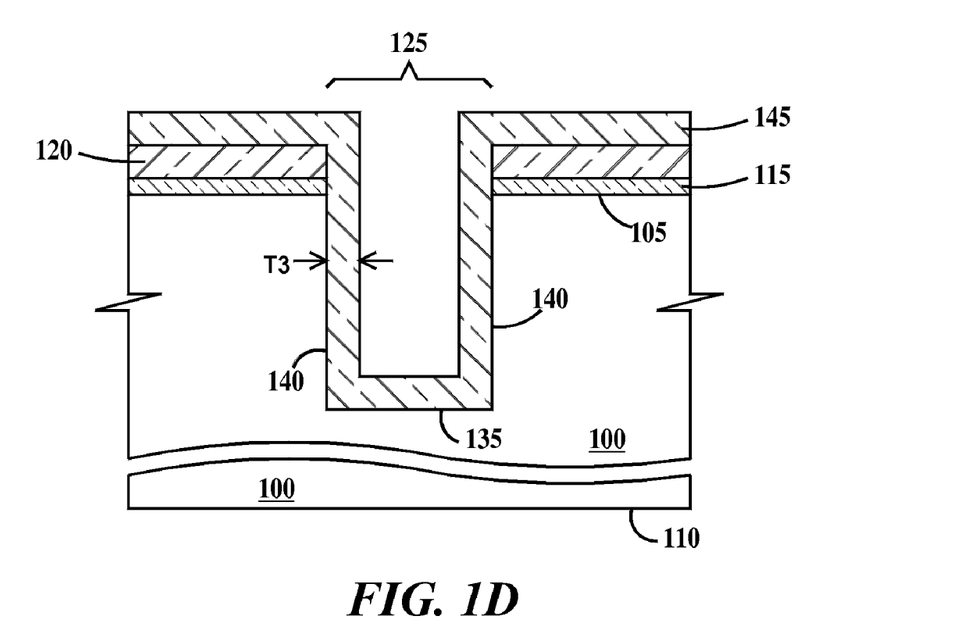

In FIG. 1D an oxidation is performed to convert polysilicon layer 130 (see FIG. 1C) to a silicon dioxide layer 145. Silicon dioxide layer 145 has a thickness T3. Silicon dioxide layer 145 does not completely fill trench 125 because the width W (see FIG. 1B) of trench 125 is greater than twice the thickness T3 of silicon dioxide layer 145. Silicon dioxide layer conformally covers the sidewalls and bottom of trench 125. In one example, T3 is about equal to half of W (see FIG. 1B). In one example, the oxidation of polysilicon layer 130 (see FIG. 1C) to form silicon dioxide layer 145 is performed using a high pressure oxidation (HIPOX) process.

HIPOX of boron doped polysilicon (i.e., layer 130 of FIG. 1C) is preferred because of the high oxidation rate of born doped polysilicon and the ability of HIPOX to form uniform oxide thicknesses in deep trenches.

The structure of FIG. 1D is the starting structure for the first second, third and fourth embodiments of the present invention.

Figure 2A:
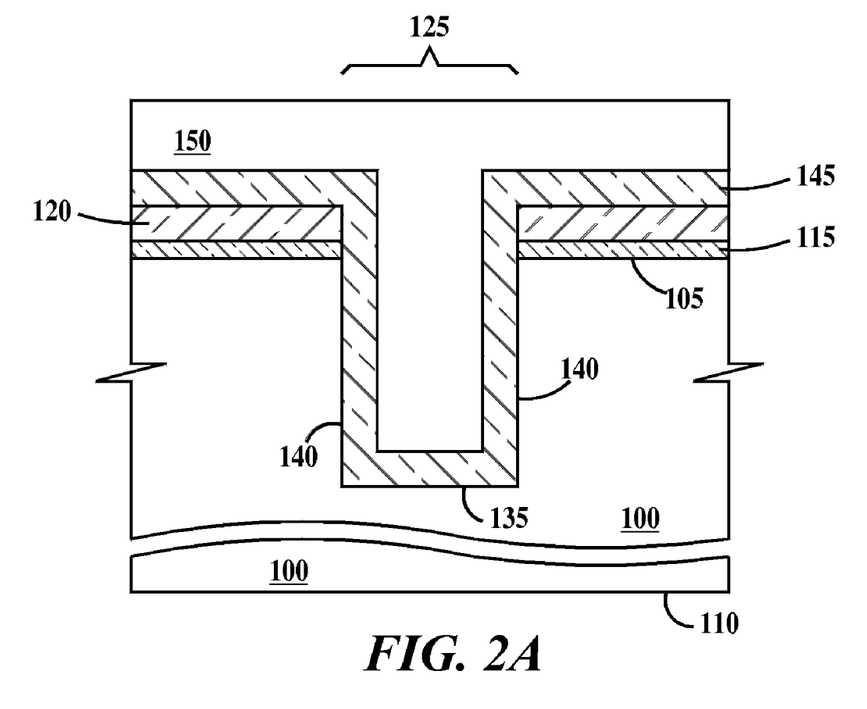
FIGS. 2A through 2D are cross-sectional drawings illustrating completion of the fabrication of the array of through wafer vias according to a first embodiment of the present invention.

FIGS. 2A through 2D are cross-sectional drawings illustrating completion of the fabrication of the array of through wafer vias according to a first embodiment of the present invention. In FIG. 2A, a polysilicon layer 150 is formed on the exposed surfaces of silicon dioxide layer 145. Polysilicon layer 150 and completely fills the remaining space in trench 125. In one example, polysilicon layer 150 comprises intrinsic (i.e., undoped) polysilicon. In a second example, the polysilicon is in-situ doped, with any known dopant such as phosphorus, arsenic, or boron.

Figure 2B:
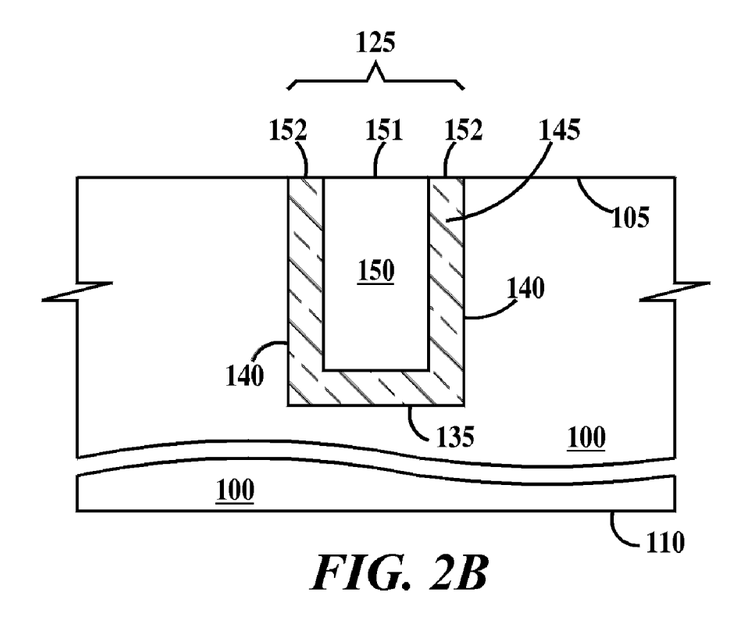

In FIG. 2B, a CMP is performed to remove excess polysilicon layer 150, excess silicon dioxide layer 145 and first and second dielectric layers 115 and 120 so top surface 105 of substrate 100 is coplanar with a top surface 151 of polysilicon layer 150 in trench 125 and edges 152 of silicon dioxide layer 145. Alternatively, any combination of CMP or lithographically patterned etch back process could be employed to planarize the wafer, as known in the art.

Figure 2C:
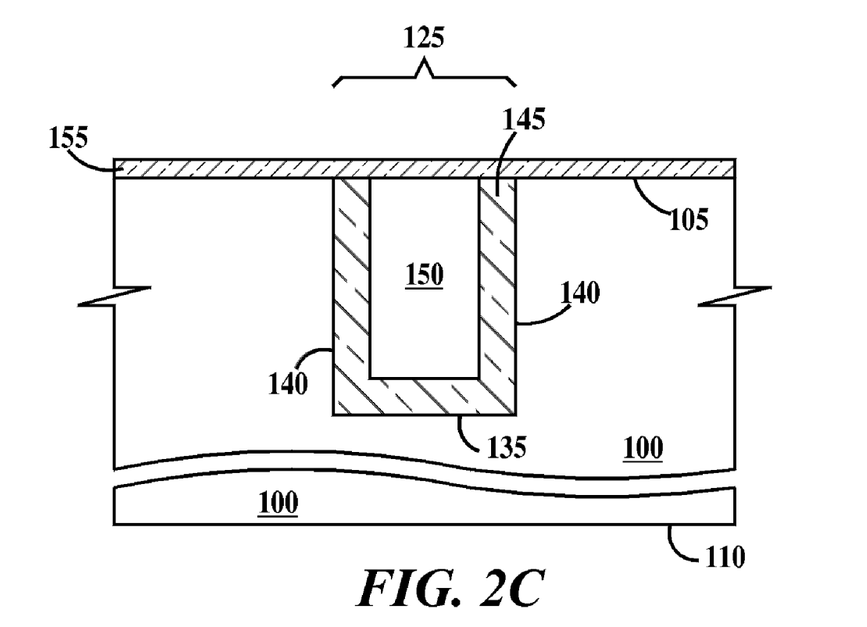

In FIG. 2C, a dielectric layer 155 is formed on now filled trench 125 and top surface 105 of substrate 100. One purpose of dielectric layer 155 is to protect top surface 105 from damage during the thinning process illustrated in FIG. 2D and described infra. Dielectric layer 155 may be a multilayer dielectric layer and may be used as a hardmask to form semiconductor devices in and on substrate 100 prior to thinning of substrate 100.

Figure 2D:
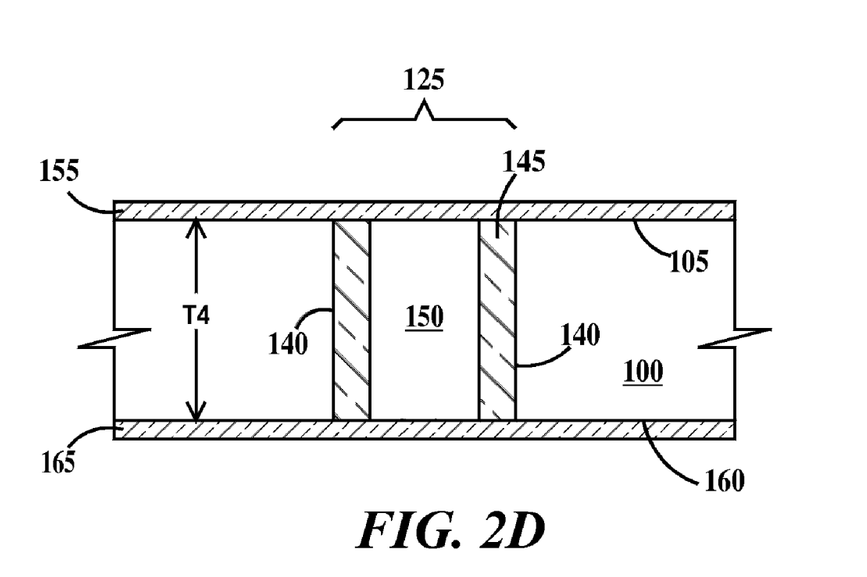

In FIG. 2D, substrate 100 is thinned from the bottom (for example, by grinding) to form a new bottom surface 160. After thinning, polysilicon layer 150 in trench 125 is exposed in bottom surface 160. After thinning the thickness of substrate 100 is reduced to T4. In one example, T4 is about 50 microns to about 200 microns. In one example, T4 is about 170 microns. After thinning a dielectric layer 165 is formed on now filled trench 125 and bottom surface 160 of substrate 100. Dielectric layer 165 may be a multilayer dielectric layer. One purpose of dielectric layer 165 is to electrically isolate substrate 100 from structures subsequently fabricated on dielectric layer 165. Filled trench 125 is now a through wafer via with a core conductor consisting of polysilicon layer 150 electrically isolated from substrate 100 by a dielectric liner consisting of silicon dioxide layer 145. Openings may be made in dielectric layers 155 and 165 and electrical contacting structures may be formed to polysilicon layer 150. A metal silicide layer may be formed in these openings prior to forming the contacting structures.

Alternatively, polysilicon layer 150 of FIGS. 2B, 2C, 2D, 3A, 3B, 3C, 3D, 3E and 3F may be replaced by one or more metals. In one example, polysilicon layer 150 may be replaced by tungsten (W) or tungsten and titanium nitride (TiN). In one example, polysilicon layer 150 may be replaced by a first deposited conformal layer of titanium nitride and a second deposited layer of tungsten. In one example, polysilicon layer 150 may be replaced by a first deposited conformal layer of titanium nitride, a second deposited layer of conformal titanium (Ti) and a third deposited layer of tungsten. Titanium, titanium nitride and tungsten may be deposited by chemical-vapor-deposition (CVD).

In one example, polysilicon layer 150 may be replaced by tungsten or tungsten and tantalum nitride (TaN). In one example, polysilicon layer 150 may be replaced by a first deposited conformal layer of tantalum nitride and a second deposited layer of tungsten In one example, polysilicon layer 150 may be replaced by a first deposited conformal layer of tantalum nitride, a second deposited layer of conformal tantalum (Ta) and a third deposited layer of tungsten. Tantalum and tantalum nitride and may be deposited using CVD.

Other metallurgical combinations that may be used replace polysilicon layer 150 include combinations of copper (Cu), ruthenium (Ru), Ta and TaN. Those combinations include the following combinations, each of which is in the order of formation: Ta/Cu, TaN/Cu, Ru/Cu, TaN/Ta/Cu/, TaN/Ru/Cu, Ta/Ru/Cu, Ru/Ta/Cu, Ru/TaN/Cu, TaN/Ta/Ru/Cu.

Figure 3A:
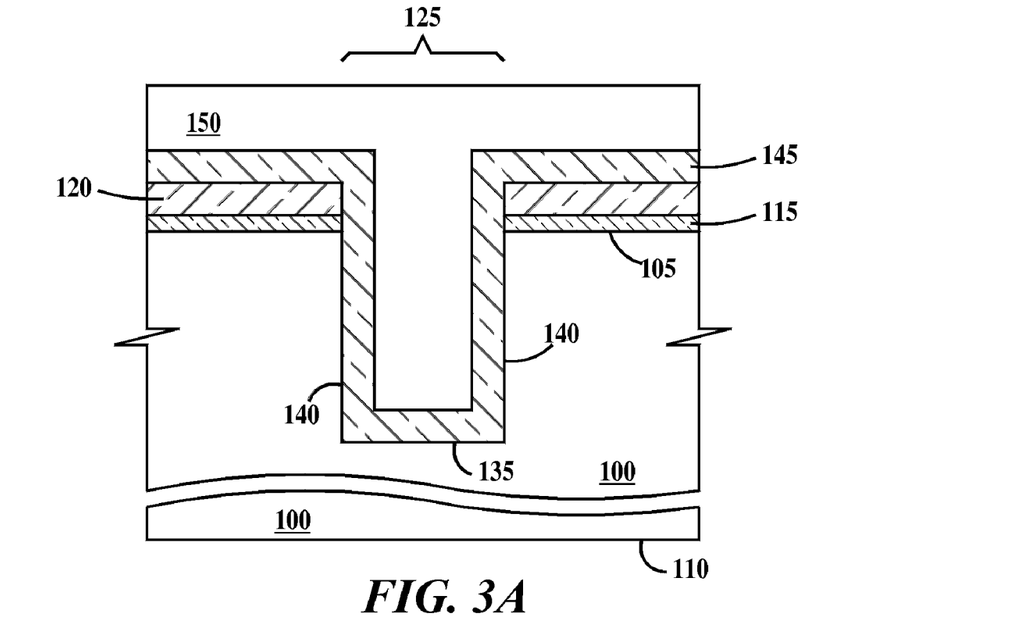
FIGS. 3A through 3F are cross-sectional drawings illustrating completion of the fabrication of the array of through wafer vias according to a second embodiment of the present invention.

FIGS. 3A through 3F are cross-sectional drawings illustrating completion of the fabrication of the array of through wafer vias according to a second embodiment of the present invention. FIG. 3A is similar to FIG. 2A.

Figure 3B:
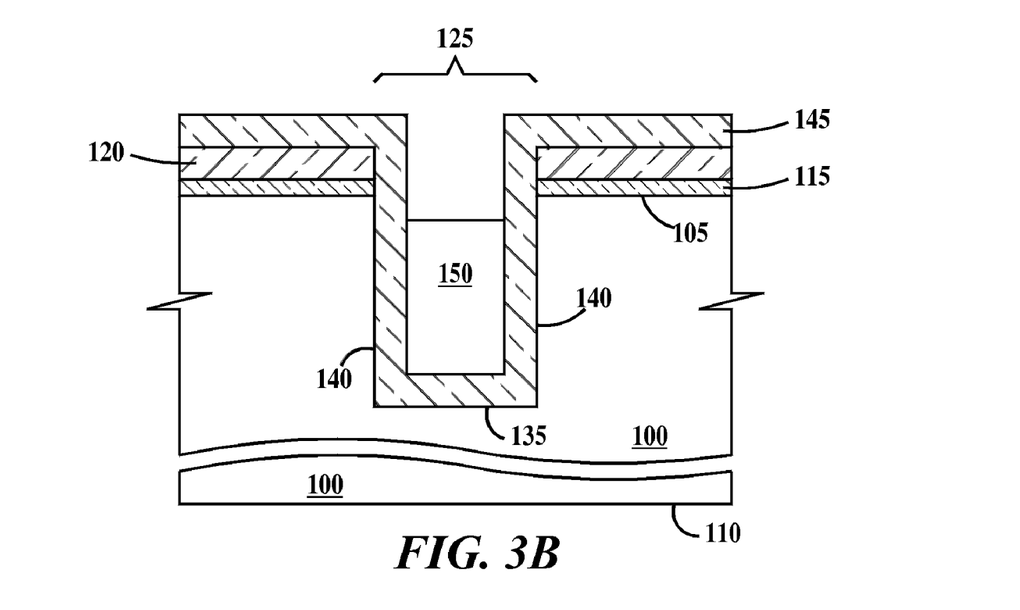

In FIG. 3B, a polysilicon recess process is performed which removes all of polysilicon layer 150 from the top surface of silicon dioxide layer 145 and from an upper region of trench 125. A top surface of polysilicon layer 150 remaining in trench 125 after the recess process is below top surface 105 of substrate 100. The polysilicon recess process may be performed using an RIE, a wet etch, or a combination of an RIE etch and a wet etch.

Figure 3C:
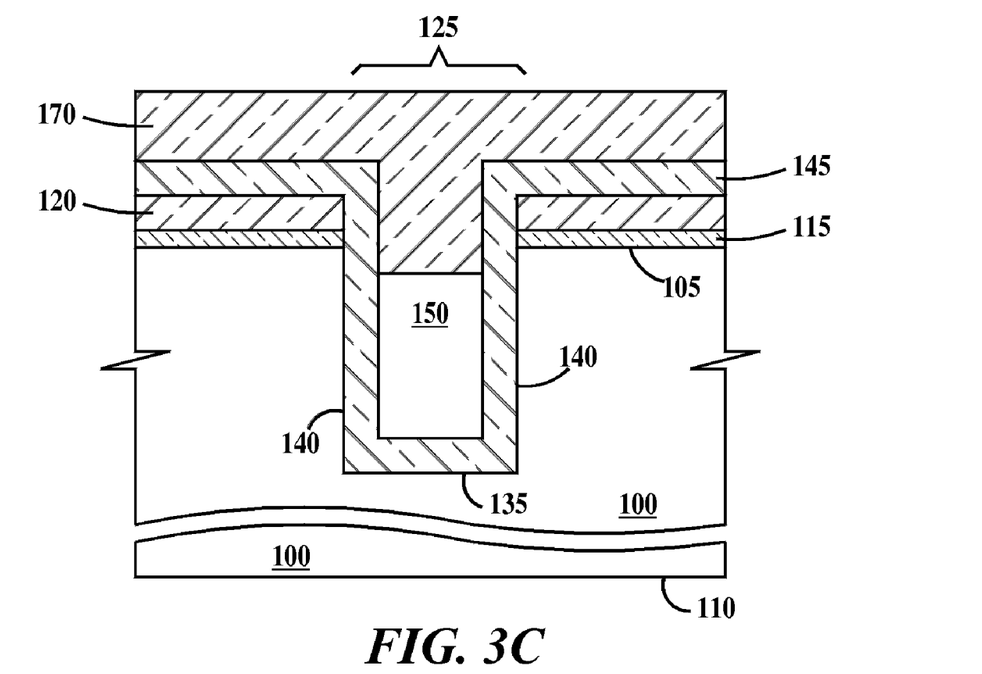

In FIG. 3C, a dielectric layer 170 is formed on the top of surface of silicon dioxide layer 155 and completely fills the space created in trench 125 created by the polysilicon recess etch of FIG. 1F. In one example dielectric layer 170 comprises TEOS oxide (i.e., oxide formed by CVD using tetraethoxysilane precursor), silane oxide (i.e., oxide formed by CVD using silane precursor), any dielectric deposited using low pressure CVD (LPCVD), any dielectric deposited using high density plasma CVD (HDPCVD) or any dielectric deposited using any other known method.

Figure 3D:
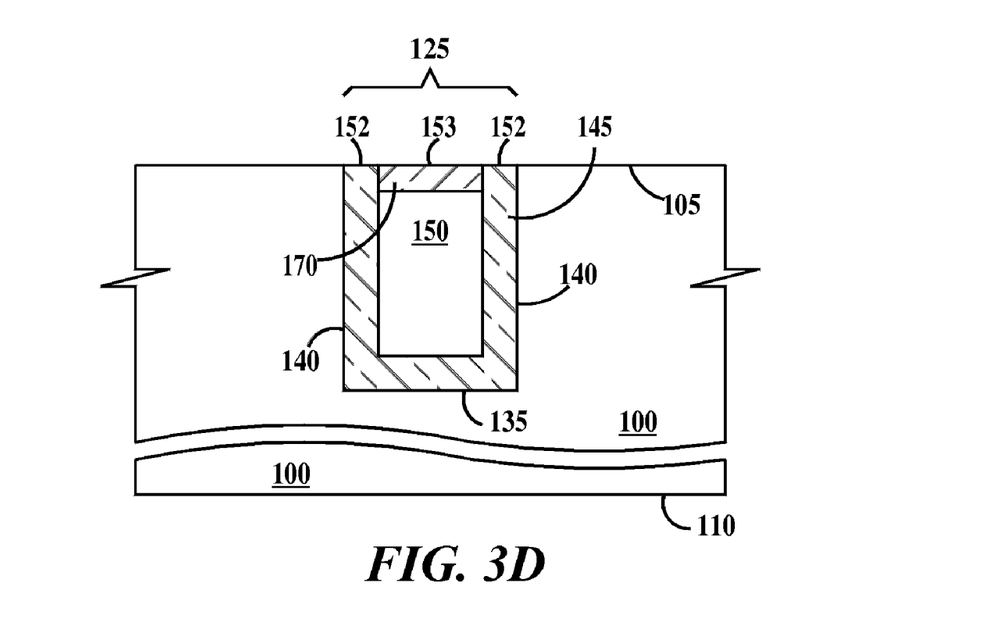

In FIG. 3D, a CMP is performed to remove excess polysilicon layer 150, excess silicon dioxide layer 145 and first and second dielectric layers 115 and 120 so top surface 105 of substrate 100 is coplanar with a top surface 153 of dielectric layer 170 in trench 125 and edges 152 of silicon dioxide layer 145. Alternatively, any combination of CMP or lithographically patterned etch back process could be employed to planarize the wafer, as known in the art.

Figure 3E:
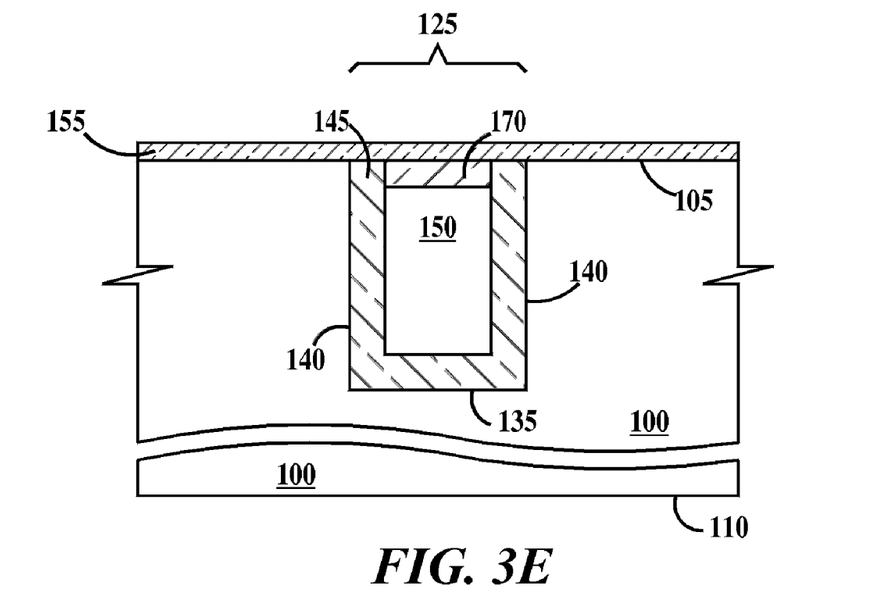
Figure 3F:
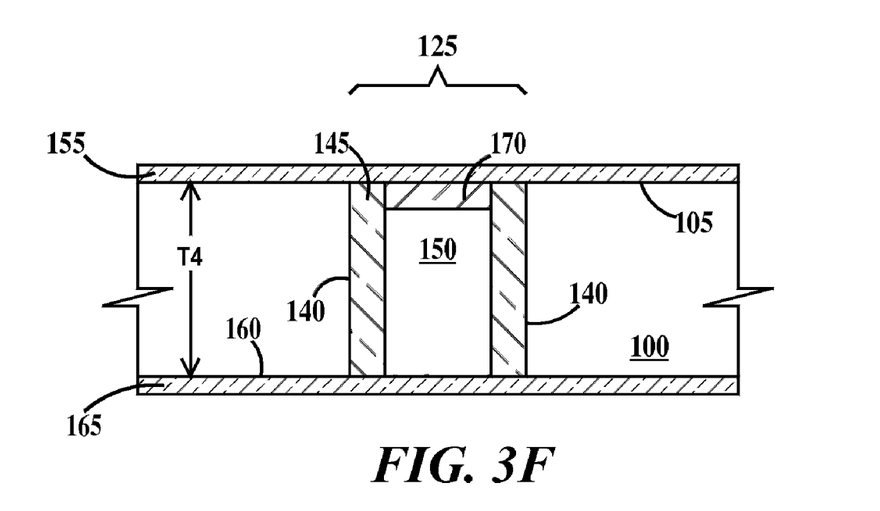

FIG. 3E is similar to FIG. 2C and FIG. 3F is similar to FIG. 2D except for dielectric layer 170 in now filled trench 125. Dielectric layer 170 must be at least partially removed in order to form electrical contact to polysilicon layer 150.

Alternatively, polysilicon layer 150 of FIGS. 2B, 2C, 2D, 3A, 3B, 3C, 3D, 3E and 3F may be replaced by one or more metals. In one example, polysilicon layer 150 may be replaced by tungsten (W) or tungsten and titanium nitride (TiN). In one example, polysilicon layer 150 may be replaced by a first deposited conformal layer of titanium nitride and a second deposited layer of tungsten. In one example, polysilicon layer 150 may be replaced by a first deposited conformal layer of titanium nitride, a second deposited layer of conformal titanium (Ti) and a third deposited layer of tungsten. Titanium, titanium nitride and tungsten may be deposited by chemical-vapor-deposition (CVD).

In one example, polysilicon layer 150 may be replaced by tungsten or tungsten and tantalum nitride (TaN). In one example, polysilicon layer 150 may be replaced by a first deposited conformal layer of tantalum nitride and a second deposited layer of tungsten In one example, polysilicon layer 150 may be replaced by a first deposited conformal layer of tantalum nitride, a second deposited layer of conformal tantalum (Ta) and a third deposited layer of tungsten. Tantalum and tantalum nitride and may be deposited using CVD.

Other metallurgical combinations that may be used replace polysilicon layer 150 include combinations of copper (Cu), ruthenium (Ru), Ta and TaN. Those combinations include the following combinations, each of which is in the order of formation: Ta/Cu, TaN/Cu, Ru/Cu, TaN/Ta/Cu/, TaN/Ru/Cu, Ta/Ru/Cu, Ru/Ta/Cu, Ru/TaN/Cu, TaN/Ta/Ru/Cu.

Figure 4A:
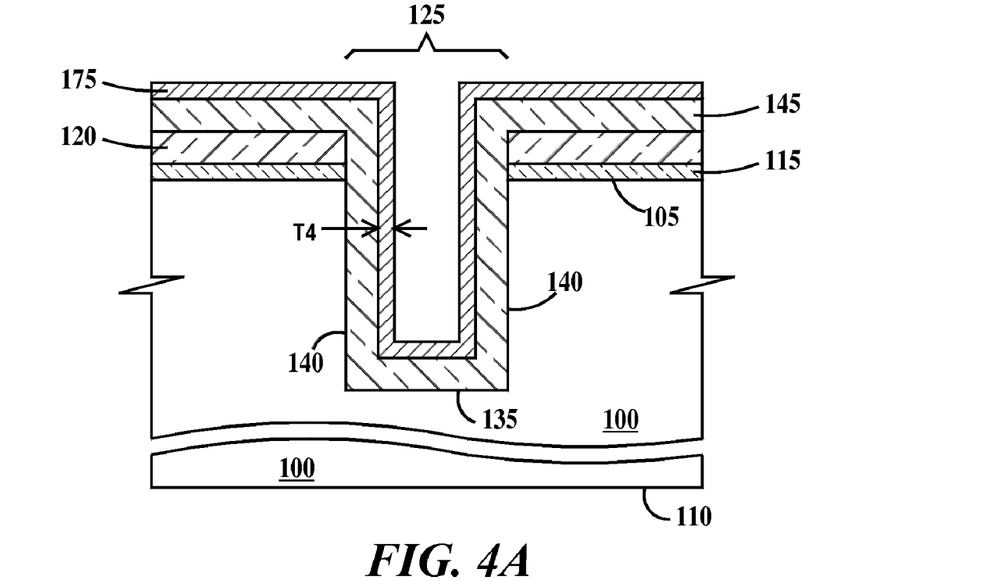
FIGS. 4A through 4E are cross-sectional drawings illustrating completion of the fabrication of the array of through wafer vias according to a third embodiment of the present invention.

FIGS. 4A through 4E are cross-sectional drawings illustrating completion of the fabrication of the array of through wafer vias according to a third embodiment of the present invention. In FIG. 4A, a conformal and electrically conductive layer 175 is formed (for example, by evaporation and/or sputtering) over all exposed surfaces of silicon dioxide layer 155. Electrically conductive layer 175 does not completely fill trench 125. In one example, electrically conductive layer 175 comprises a metal. In one example electrically conductive layer 175 comprises tungsten or tungsten and titanium nitride. In one example electrically conductive layer 175 comprises a first deposited conformal layer of titanium nitride and a second deposited layer of tungsten. Electrically conductive layer 175 has a thickness T5, where T5 is less than half of W-twice T3 (see FIGS. 1B and 1D respectively).

Figure 4B:
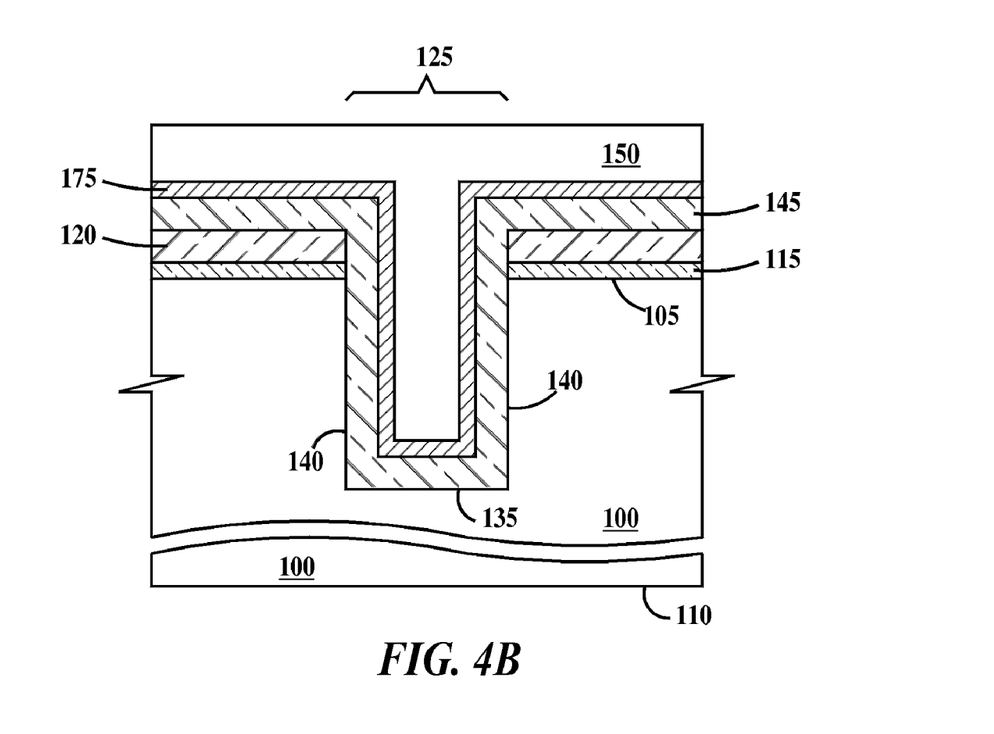

In FIG. 4B, a polysilicon layer 150 is formed on the exposed surfaces of silicon conductive layer 175. Polysilicon layer 150 and completely fills the remaining space in trench 125. In one example, polysilicon layer 150 comprises intrinsic (i.e., undoped) polysilicon. In a second example, the polysilicon is in-situ doped, with any known dopant such as phosphorus, arsenic, or boron.

Figure 4C:
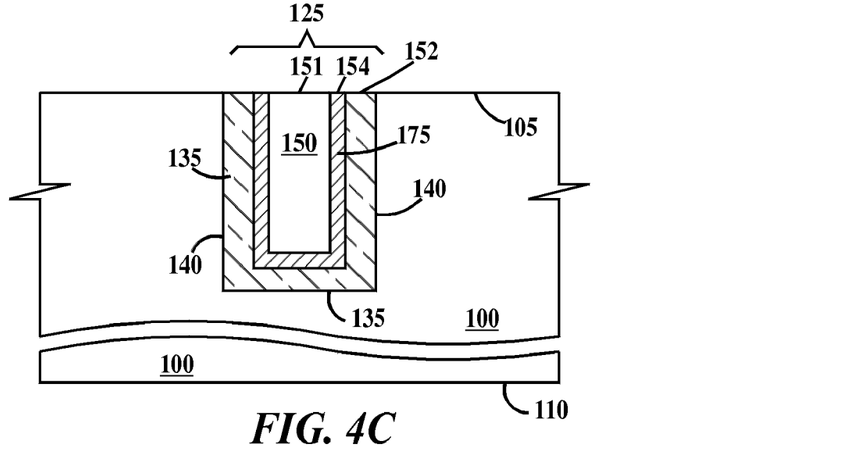

In FIG. 4C, a CMP is performed to remove excess polysilicon layer 150, excess silicon dioxide layer 145 and first and second dielectric layers 115 and 120 so top surface 105 of substrate 100 is coplanar with a top surface 151 of polysilicon layer 150 in trench 125 and edges 152 of silicon dioxide layer 145 and edges 154 of conductive layer 175. Alternatively, any combination of CMP or lithographically patterned etch back process could be employed to planarize the wafer, as known in the art.

Figure 4D:
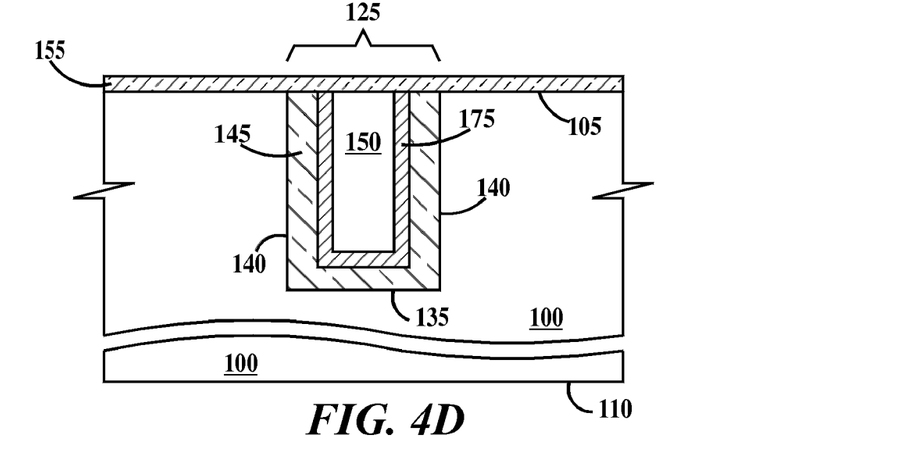

In FIG. 4D, dielectric layer 155 is formed on now filled trench 125 and top surface 105 of substrate 100. One purpose of dielectric layer 155 is to protect top surface 105 from damage during the thinning process illustrated in FIG. 4E and described infra. Dielectric layer 155 may be a multilayer dielectric layer and may be used as a hardmask to form semiconductor devices in and on substrate 100 prior to thinning of substrate 100.

Figure 4E:
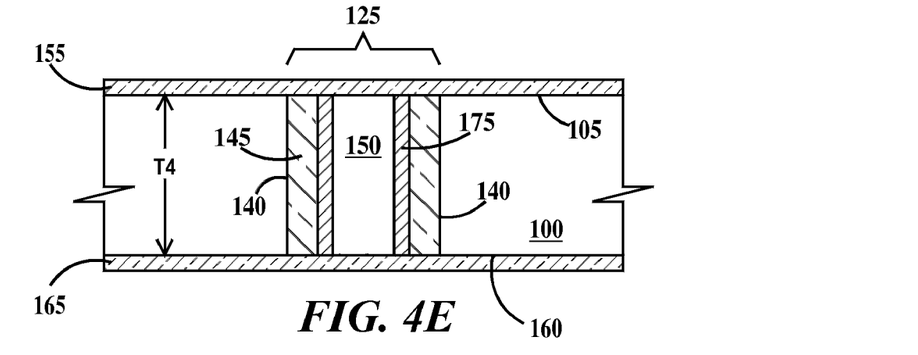

In FIG. 4E, substrate 100 is thinned from the bottom (for example, by grinding) to form a new bottom surface 160. After thinning, polysilicon layer 150 in trench 125 is exposed in bottom surface 160. After thinning the thickness of substrate 100 is reduced to T4. After thinning a dielectric layer 165 is formed on now filled trench 125 and bottom surface 160 of substrate 100. Dielectric layer 165 may be a multilayer dielectric layer. One purpose of dielectric layer 165 is to electrically isolate substrate 100 from structures subsequently fabricated on dielectric layer 165. Filled trench 125 is now a through wafer via with a core conductor consisting of polysilicon layer 150 electrically, an electrically conductive liner consisting of conductive layer 175, both isolated from substrate 100 by a dielectric liner consisting of silicon dioxide layer 145. Openings may be made in dielectric layers 155 and 165 and electrical contacting structures may be formed to polysilicon layer 150. A metal silicide layer may be formed in these openings prior to forming the contacting structures.

Figure 5A:
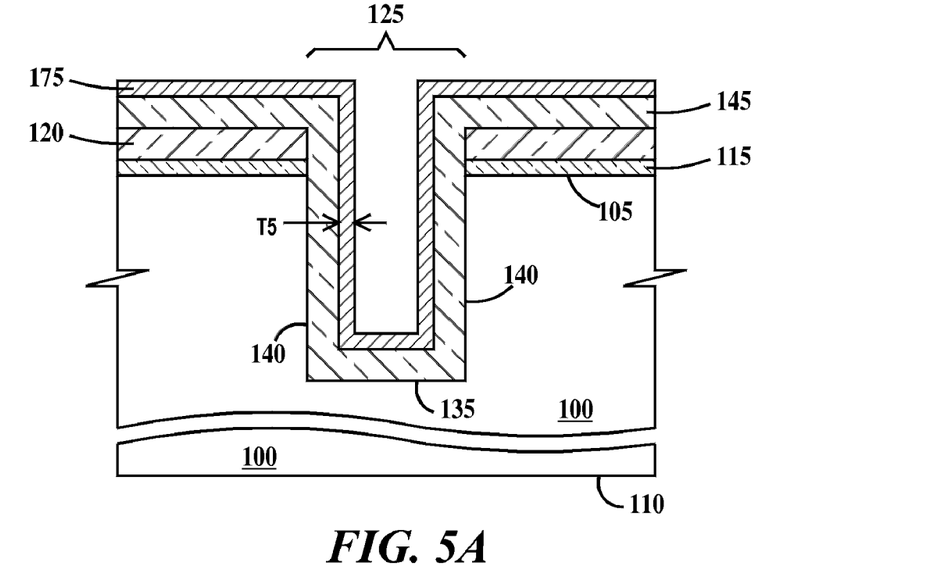
FIGS. 5A through 5G are cross-sectional drawings illustrating completion of the fabrication of the array of through wafer vias according to a fourth embodiment of the present invention.
Figure 5B:
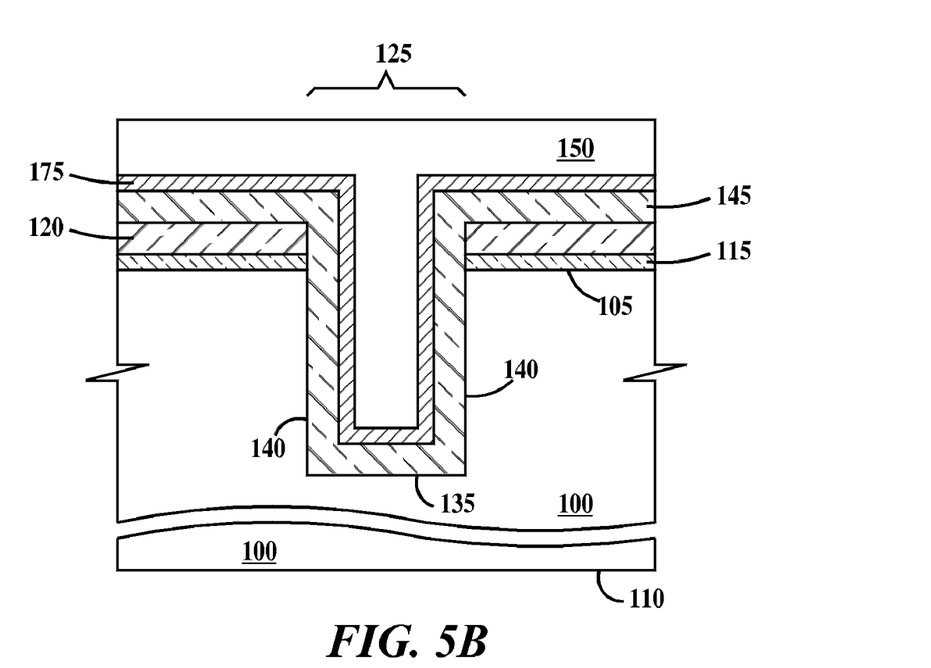

FIGS. 5A through 5G are cross-sectional drawings illustrating completion of the fabrication of the array of through wafer vias according to a fourth embodiment of the present invention. FIG. 5A is similar to FIG. 4A and FIG. 5B is similar to FIG. 4B.

Figure 5C:
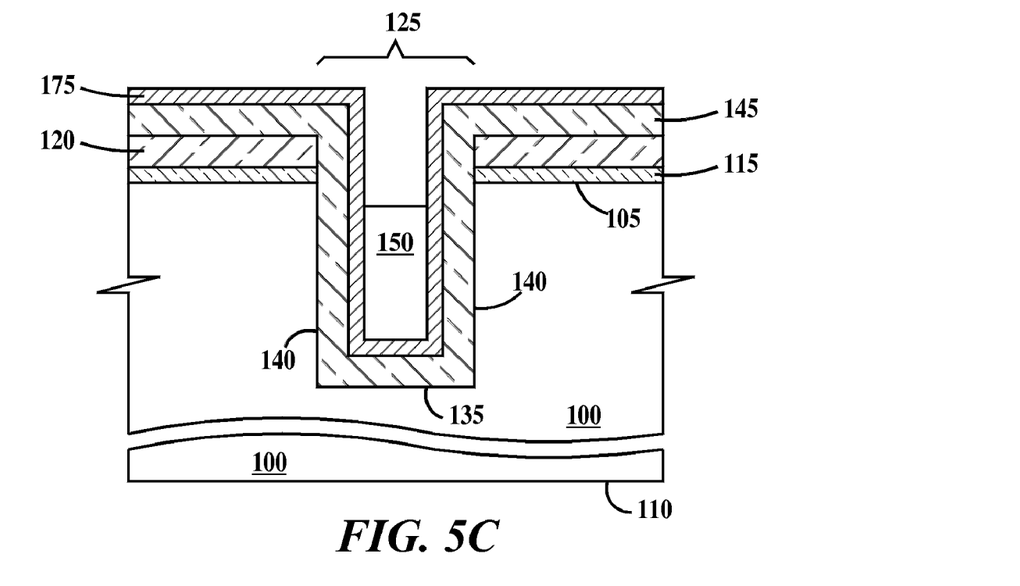

In FIG. 5C, a polysilicon recess process is performed which removes all of polysilicon layer 150 from the top surface of silicon dioxide layer 145 and from an upper region of trench 125. A top surface of polysilicon layer 150 remaining in trench 125 after the recess process is below top surface 105 of substrate 100. The polysilicon recess process may be performed using an RIE, a wet etch, or a combination of an RIE etch and a wet etch.

Figure 5D:
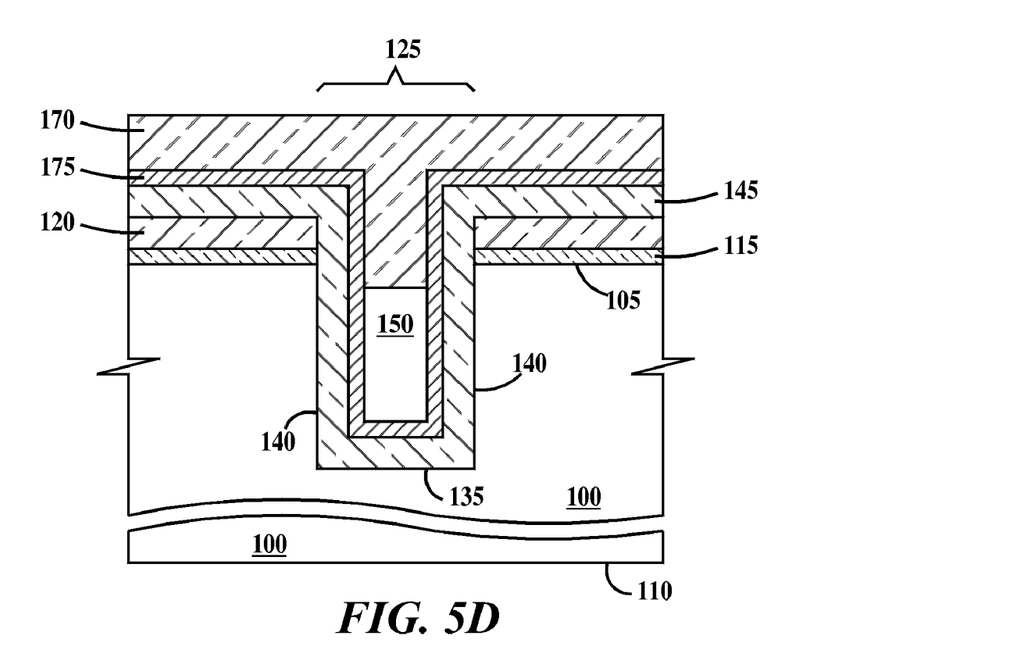

In FIG. 5D dielectric layer 170 is formed on the top of surface of silicon dioxide layer 155 and completely fills the space created in trench 125 created by the polysilicon recess etch of FIG. 1F.

Figure 5E:
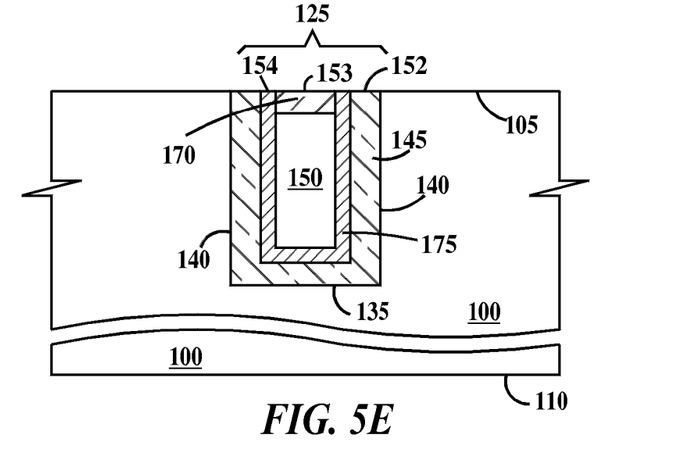

In FIG. 5E, a CMP is performed to remove excess conductive layer 170, excess polysilicon layer 150, excess silicon dioxide layer 145 and first and second dielectric layers 115 and 120 so top surface 105 of substrate 100 is coplanar with a top surface 153 of dielectric layer 170 in trench 125, edges 154 of conductive layer 175 and edges 152 of silicon dioxide layer 145. Alternatively, any combination of CMP or lithographically patterned etch back process could be employed to planarize the wafer, as known in the art.

Figure 5F:
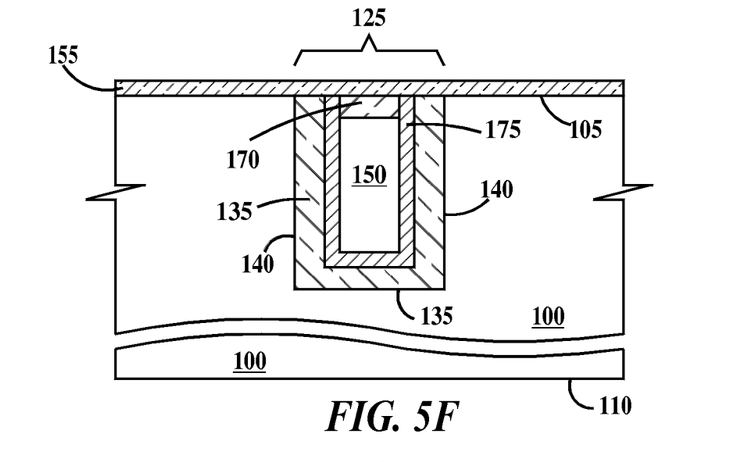
Figure 5G:
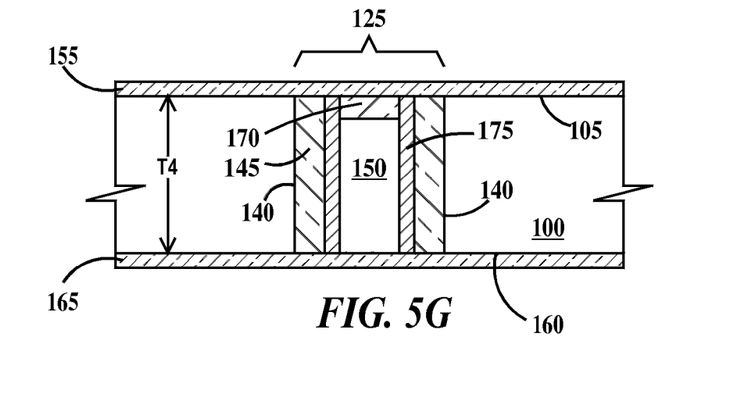

FIG. 5F is similar to FIG. 4D and FIG. 5G is similar to FIG. 4E except for dielectric layer 170 in now filled trench 125. Dielectric layer 170 must be at least partially removed in order to form direct physical and electrical contact to polysilicon layer 150. However, dielectric layer 170 may be left in place if direct physical and electrical contact is made to conductive layer 175.

Thus, the embodiments of the present invention provide a method of forming through wafer vias in semiconductor substrates.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:
1. A method, comprising:
 forming a trench in a semiconductor substrate, said trench open to a top surface of said substrate;
 forming a polysilicon layer on sidewalls and a bottom of said trench;

oxidizing said polysilicon layer to convert said polysilicon layer to a silicon oxide layer on said sidewalls and bottom of said trench, said silicon oxide layer not filling said trench;

filling remaining space in said trench with an electrical conductor; and thinning said substrate from a bottom surface of said substrate and removing said silicon oxide layer from said bottom of said trench.

2. The method of claim 1, wherein said polysilicon layer is doped N or P type.

3. The method of claim 1, where said polysilicon layer is doped with boron.

4. The method of 1, wherein said oxidizing said polysilicon layer is performed using a high pressure oxidation (HIPOX) process.

5. The method of claim 1, where said electrical conductor is polysilicon.

6. The method of claim 1, wherein said electrical conductor layer is polysilicon doped with phosphorus, arsenic, or boron.

7. The method of claim 1, wherein said electrical conductor comprises a metal.

8. The method of claim 1, wherein said electrical conductor comprises (i) tungsten, (ii) copper, (iii) tungsten in combination with titanium, titanium nitride or titanium and titanium nitride, (iv) tungsten in combination with tantalum and tantalum nitride, (v) copper in combination with one or more of titanium, titanium nitride and ruthenium, or (vi) copper in combination with one or more of tantalum, tantalum nitride and ruthenium.

9. The method of claim 1, wherein said substrate is a silicon substrate.

10. The method of claim 1, wherein said substrate is a silicon-on-insulator substrate, a region of a top surface of a buried oxide layer of said substrate exposed in said bottom of said trench, and said thinning said substrate removes said buried oxide layer.

11. The method of claim 1, further including:
after said filling remaining space and before said thinning said substrate, removing a less than whole portion of said electrical conductor from said trench so a top surface of said electrical conductor is below said top surface of said substrate and backfilling said trench with an electrical insulator.

12. A method, comprising:
forming a trench in a semiconductor substrate, said trench open to a top surface of said substrate;

forming a polysilicon layer on sidewalls and a bottom of said trench;

oxidizing said polysilicon layer to convert said polysilicon layer to a silicon oxide layer on said sidewalls and bottom of said trench, said silicon oxide layer not filling said trench;

forming a metal layer on said silicon oxide layer, said metal layer not filling said trench;

filling remaining space in said trench with a polysilicon fill; and thinning said substrate from a bottom surface of said substrate and removing said silicon oxide layer from said bottom of said trench.

13. The method of claim 12, wherein said polysilicon layer is doped N or P type.

14. The method of claim 12, where said polysilicon layer is doped with boron.

15. The method of 12, wherein said oxidizing said polysilicon layer is performed using a high pressure oxidation (HIPOX) process.

16. The method of claim 12 where in said metal layer comprises tungsten, tungsten and titanium nitride, or a first deposited conformal layer of titanium nitride and a second deposited layer of tungsten.

17. The method of claim 12, wherein said polysilicon fill is polysilicon doped with phosphorus, arsenic, or boron.

18. The method of claim 12, wherein said substrate is a silicon substrate.

19. The method of claim 12, wherein said substrate is a silicon-on-insulator substrate, a region of a top surface of a buried oxide layer of said substrate exposed in said bottom of said trench, and said thinning said substrate removes said buried oxide layer.

20. The method of claim 12, further including:
after said filling remaining space and before said thinning said substrate, removing a less than whole portion of said electrical conductor from said trench so a top surface of said electrical conductor is below said top surface of said substrate and backfilling said trench with an electrical insulator.

* * * * *